United States Patent [19]

Cory et al.

[11] Patent Number: 5,317,263

[45] Date of Patent: May 31, 1994

[54] METHOD FOR CREATING A Z-ROTATION USING RADIAL PULSES IN NMR EXPERIMENTS INVOLVING COHERENCE TRANSFORMATIONS

[75] Inventors: David G. Cory, Boston; Werner E. Maas, Billerica, both of Mass.

[73] Assignee: Bruker Instruments, Inc., Billerica, Mass.

[21] Appl. No.: 32,612

[22] Filed: Mar. 17, 1993

[51] Int. Cl.[5] ............................................. G01V 3/00
[52] U.S. Cl. .................................................. 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,443,760 | 4/1984 | Edelstein et al. | 324/309 |
| 4,484,138 | 11/1984 | Bottomley et al. | 324/307 |
| 4,585,993 | 4/1986 | Bottomley | 324/309 |
| 4,697,149 | 9/1987 | Moran | 324/309 |
| 4,727,324 | 2/1988 | Bendall et al. | 324/309 |
| 4,728,892 | 3/1988 | Vinegar et al. | 324/309 |
| 5,019,784 | 5/1991 | Garwood et al. | 324/307 |

*Primary Examiner*—Michael J. Tokar
*Attorney, Agent, or Firm*—Cesari and McKenna

[57] ABSTRACT

A composite RF pulse for NMR experiments is created by applying to a sample a radial pulse followed by a $\pi$ homogeneous pulse. The radial pulse has a uniform RF field strength throughout the sample and a phase relative to the detection coil phase with a spatial dependence such that all possible phase differences are equally represented throughout the sample. The composite pulse converts the radial RF pulse into a spatially-varying z rotation. The creation of a spatially-varying composite z pulse based on a radial pulse allows for a simple and direct application of a radial pulse in a manner analogous to many known $B_0$ gradient NMR experiments (such as multiple-quantum filters, quadrature detection, and solvent suppression).

7 Claims, 1 Drawing Sheet

RADIAL FIELD

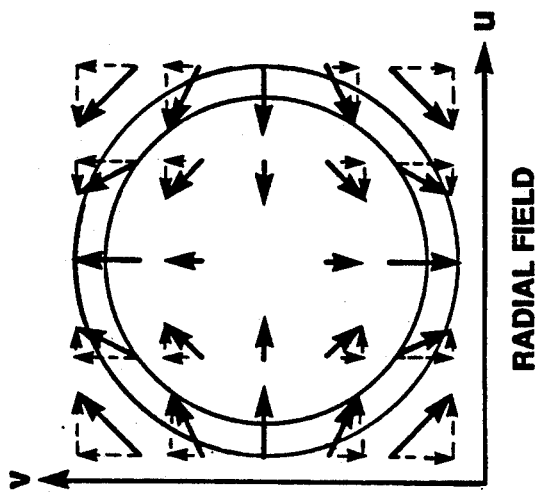
FIG. 1 HOMOGENEOUS FIELD
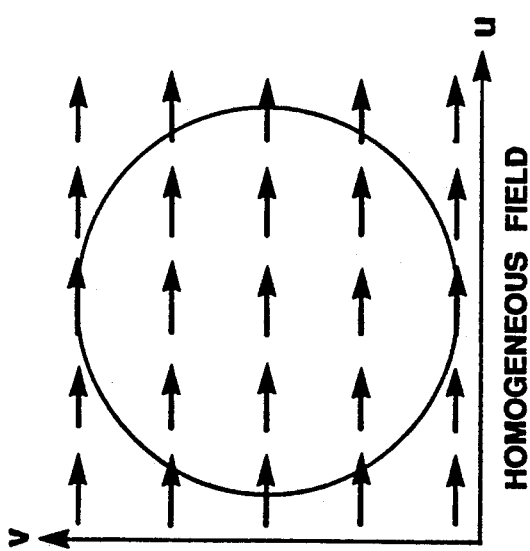
FIG. 2 RADIAL FIELD
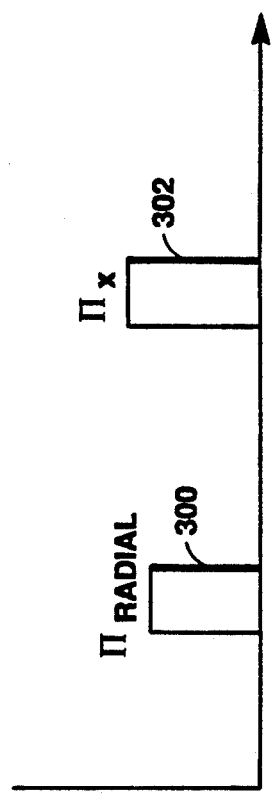
FIG. 3

METHOD FOR CREATING A Z-ROTATION USING RADIAL PULSES IN NMR EXPERIMENTS INVOLVING COHERENCE TRANSFORMATIONS

FIELD OF THE INVENTION

This invention relates to nuclear magnetic resonance (NMR) spectroscopy and, in particular, to high resolution NMR experiments utilizing radial RF pulses.

BACKGROUND OF THE INVENTION

All atomic nuclei of elements with an odd atomic mass or an odd atomic number possess a nuclear magnetic moment. Nuclear magnetic resonance is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split in to (2I+1) non-degenerate energy levels, which are separated from each other by an energy difference that is directly proportional to the strength of the applied magnetic field. This splitting is called the "Zeeman" splitting and the energy difference is equal to $\gamma h H_0/2\pi$, where h is Plank's constant and $H_0$ is the strength of the applied magnetic field. The frequency corresponding to the energy of the Zeeman splitting ($\omega_0 = \gamma H_0$) is called the "Larmor frequency" and is proportional to the field strength of the magnetic field. Typical NMR active nuclei include $^1H$ (protons), $^{13}C$, $^{19}F$, and $^{31}P$. For these four nuclei $I=\frac{1}{2}$, and each nucleus has two nuclear magnetic energy levels.

When a bulk sample of material containing NMR active nuclei is placed within a magnetic field called the main static field, the nuclear spins distribute themselves amongst the nuclear magnetic energy levels in accordance with Boltzmann's statistics. This results in a population imbalance among the energy levels and a net nuclear magnetization. It is this net nuclear magnetization that is studied by NMR techniques.

At equilibrium, the net nuclear magnetization of the aforementioned bulk sample is aligned parallel to the external magnetic field and is static (by convention, the direction of the main static field is taken to be the z-axis). A second magnetic field perpendicular to the main static magnetic field and rotating at, or near, the Larmor frequency can be applied to induce a coherent motion of the net nuclear magnetization. Since, at conventional main static magnetic field strengths, the Larmor frequency is in the megahertz frequency range, this second magnetic field is called a "radio frequency" or RF field.

The effect of the RF field is to shift the nuclear magnetization direction so that it is no longer parallel to the main static field. This shift introduces a net coherent motion of the nuclear magnetization about the main static field direction called a "nutation". In order to conveniently deal with this nutation, a reference frame is used which rotates about the laboratory reference frame z-axis at the Larmor frequency and also has its z-axis parallel to the main static field direction. In this "rotating frame" the net nuclear magnetization, which is rotating in the stationary "laboratory" reference frame, is now static.

Consequently, the effect of the RF field is to rotate the now static nuclear magnetization direction at an angle with respect to the main static field direction (z-axis). The new magnetization direction can be broken into a component which is parallel to the main field direction (z-axis direction) and a component which lies in the plane transverse to the main magnetization (x,y plane). The RF field is typically applied in pulses of varying length and amplitude and, by convention, an RF pulse of sufficient amplitude and length to rotate the nuclear magnetization in the rotating frame through an angle of 90°, or $\pi/2$ radians, and entirely into the x,y plane is called a "$\pi/2$ pulse".

Because the net nuclear magnetization is rotating with respect to the laboratory frame, the component of the nuclear magnetization that is transverse to the main magnetic field or that lies in the x,y plane rotates about the external magnetic field at the Larmor frequency. This rotation can be detected with a receiver coil that is resonant at the Larmor frequency. The receiver coil is generally located so that it senses voltage changes along one axis (for example, the x-axis) where the rotating magnetization component appears as an oscillating voltage. Frequently, the "transmitter coil" employed for applying the RF field to the sample and the "receiver coil" employed for detecting the magnetization are one and the same coil.

Although the main static field is applied to the overall material sample, the nuclear magnetic moment in each nucleus within the sample actually experiences an external magnetic field that is changed from the main static field value due to a screening from the surrounding electron cloud. This screening results in a slight shift in the Larmor frequency for that nucleus (called the "chemical shift" since the size and symmetry of the shielding effect is dependent on the chemical composition of the sample).

In a typical NMR experiment, the sample is placed in the main static field and a $\pi/2$ pulse is applied to shift the net magnetization into the transverse plane (called transverse magnetization). After application of the pulse, the transverse magnetization, or "coherence", begins to precess about the x-axis, or evolve, due to the chemical shifts at a frequency which is proportional to the chemical shift field strength. In the rotating frame, the detector (which is stationary in the laboratory frame) appears to rotate at the Larmor frequency. Consequently, the detector senses an oscillation produced by an apparent magnetization rotation at a frequency which is proportional to the frequency difference between the Larmor frequency and the chemical shift frequency.

Thus, the detected signal oscillates at the frequency shift difference. In addition to precessing at the Larmor frequency, in the absence of the applied RF field energy, the nuclear magnetization also undergoes two spontaneous processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$. The latter process causes the received signal to decay to zero. The decaying, oscillating signal is called a free induction decay (FID).

Although many NMR experiments are designed such that the spin dynamics are uniform through the sample, there are cases where it is advantageous to impose a spatial heterogeneity across the sample. Some examples include imaging experiments, diffusion experiments, coherence transfer experiments where the heterogeneity may be used as a means of allowing a variation in coherence pathways, and multiple-quantum filtering experiments.

All of these latter experiments can be performed with a spatially-varying magnetic field. Some common examples of such a spatially-varying field include $B_0$ and $B_1$ magnetic field gradients which are gradients along the direction of the main static field and in the plane transverse to the main static field direction, respectively. Another spatially-varying field is the field associated with a "radial pulse". A "radial" RF pulse is a pulse that has a uniform RF field strength throughout the sample and a phase (relative to the detection coil phase) with a spatial dependence such that all possible phase differences are equally represented throughout the sample. Such a pulse is described in more detail in a copending patent application entitled "Method for Improving Selectivity in NMR Experiments Involving Coherence Transformation", filed on Mar. 12, 1993 by David G. Cory, Frank H. Laukien and Werner E. Maas and assigned to the same assignee as the present invention, which application is hereby incorporated by reference.

The application of an RF radial field to the sample corresponds to inducing spin evolution about an axis in the transverse plane, and it is the phase angle of this axis of rotation that varies across the sample.

For certain experiments (such as multiple quantum filters) it is advantageous to apply a spatially-varying rotation about the z-axis. As used in the discussion below, the word "coherence" describes a transition between different energy levels. The transitions are characterized by a change $\Delta m_z$ in the quantum number, $m_z$ and the change $\Delta m_z$ is called the coherence number. In any given system, only certain changes or coherence numbers are possible in accordance with quantum theory. If an RF pulse sequence is applied to a spin system, many of the possible coherences occur under the influence of RF pulses, but only those in which the change $\Delta m_z$ is $\pm 1$ produce observable magnetization in accordance with the "selection rule" for NMR spectroscopy.

A multiple quantum filtering experiment is based on the simple idea that an $\omega I_z$ interaction drives an n-quantum coherence at a rate of $n\omega$ about the z-axis and takes advantage of the NMR selection rule. For example, if a sample is placed in a multiple quantum state involving single, double and triple quantum coherences and then a spatially-varying z rotation is applied, the triple quantum term will evolve three times as far as the single quantum term and the double quantum will evolve twice as far as the single quantum term. However, all coherences will be dephased.

If the multiple-quantum coherences are then converted into single quantum coherences (that is, observable magnetization) they will still be dephased. The application of a gradient equal to $-1$ times the original gradient will refocus the coherences that evolved through a single quantum state. Similarly, the application of a gradient equal to $-2$ times the original gradient will refocus the coherences that evolved through a double quantum state, and, finally, the application of a gradient equal to $-3$ times the original gradient will refocus the coherences that evolved through a triple quantum state. Thus, a filter for a specific coherence transformation can be constructed.

RF pulse sequences that introduce a spatially-varying z rotation are known in relationship to $B_0$ and $B_1$ gradients, but no such pulse configuration is known for radial pulses. Accordingly, it is an object of the present invention to provide a pulse sequence that converts a radial RF pulse into a spatially varying z rotation.

SUMMARY OF THE INVENTION

The foregoing problems are overcome and the foregoing object is achieved in an illustrative embodiment of the invention in which a composite pulse is created comprising a radial pulse followed by a $\pi$ homogeneous pulse. The composite pulse converts the radial RF pulse into a spatially-varying z rotation.

The creation of a spatially-varying composite z pulse based on a radial pulse allows for a simple and direct application of a radial pulse in a manner analogous to many known $B_0$ gradient experiments (such as multiple-quantum filters, quadrature detection, and solvent suppression).

BRIEF DESCRIPTION OF THE DRAWING

FIG. 1 is a schematic illustration of a field distribution in a homogeneous RF coil.

FIG. 2 is a schematic illustration of a field distribution in a radial RF coil. The shaded area corresponds to the sample volume which is restricted to an annular region so that the RF field strength is uniform throughout the sample.

FIG. 3 is a diagram of the inventive composite pulse.

DETAILED DESCRIPTION OF THE PREFERRED EMBODIMENTS

As previously mentioned, a radial pulse has a uniform RF field strength but a spatially-varying phase. A homogeneous pulse has a field with a uniform field strength and a phase which is constant over the sample. For convenience in discussing the symmetry of the two fields, both fields can be normalized to the phase of the homogeneous field which is defined as having a spatial RF field profile of the form:

$$B_H(\vec{r},t) = 2B_1 \cos(\omega_{rf}t)\{\cos(\theta)\hat{e}_x^L + \sin(\theta)\hat{e}_y^L\} \quad (1)$$

where $\hat{e}_x^L$ and $\hat{e}_y^L$ define the directions of the laboratory frame, $\theta$ is the phase of the RF field (generated in the transmitter) and it is assumed that, at an instant in time, the field is spatially uniform throughout the transverse plane. For an "x" pulse, $\theta$ is equal to zero. The corresponding rotating frame Hamiltonian is:

$$H_H(t) = -B_1\gamma\{\cos(\omega_{rf}t+\theta)I_x + \sin(\omega_{rf}t+\theta)I_y\} \quad (2)$$

which is spatially uniform. The spatial distribution of the homogeneous RF field in the transverse plane is shown schematically in FIG. 1 where each of the horizontal arrows represents the local field strength.

In contrast, the radial configuration has an RF field profile of the form:

$$B_R(\vec{r},t) = 2B_1 \cos(\omega_{rf}t)\{\cos(\Phi(\vec{r})+\theta)\hat{e}_x^L + \sin(\Phi(\vec{r})+\theta)\hat{e}_y^L\} \quad (3)$$

where $\phi(\vec{r})$ is a phase dependence of the RF field as a function of location, $\theta$ is the transmitter phase and the desired symmetry is cylindrical at least within an annular sample. Therefore, the spatial variation is only an angular variation in phase:

$$\Phi(\vec{r}) = \Phi(\Psi) = \Psi + \psi \tag{4}$$

where $\Psi$ is the angle in the laboratory frame that identifies the spin of interest, and $\psi$ is a phase offset. The RF field is a function of the angular position of the spin within the sample, and the phase angle of the RF field at this position is a linear function of this angle in the laboratory frame. A schematic representation of an illustrative radial RF field in the transverse plane is shown in FIG. 2, where the field strength is uniform within the annular sample indicated by the shaded ring. Since an annular sample will be assumed for the following discussion, the variation of the RF field strength with radius shown in FIG. 2 will be neglected for the discussion below. In addition, other coil geometries and configurations can be used to generate the field.

The RF field shown in FIG. 2 can be generated by a probe with a coil that simultaneously generates two gradient fields that are orthogonal to each other. With proper spatial amplitude variation, the two fields will be superimposed to form the radial field as shown schematically in FIG. 2. A probe with coils that are capable of generating such a field is disclosed in more detail in a copending application entitled "An Improved NMR Probe Which Includes B₁ Gradient Coils", filed on Mar. 12, 1993 by David G. Cory, Frank H. Laukien and Werner Mass and assigned to the same assignee as the present invention, which application is hereby incorporated by reference.

Such a probe is capable of generating two RF magnetic fields with different symmetries: homogeneous and radial. However, both RF fields are derived from the same transmitter, and so the two RF fields are coherent (although not in phase). The probe can be actively switched between generation of these two field configurations. The switching time between these two field configurations should be typically shorter than 10 μs, and the probe is designed to be switched to either state at any time during an experiment. For example, any RF pulse in an experimental sequence may be applied as either a homogeneous or a radial pulse, and the detection may be carried out with the receiver coil configured in either the homogeneous or radial configuration.

Since the object of the present invention is to generate a pulse which causes rotation about the z-axis, it is assumed that the magnetization of interest is not initially along the z-axis and is therefore distributed throughout the x,y plane. Following the composite z rotation the magnetization should still be in the x,y plane.

The simplest radial pulse that will take magnetization from the x,y plane and redistribute this magnetization throughout the x,y plane is a $\pi$ pulse and a $\pi$ radial pulse is correctly described by the set of three rotations applied in the following sequence:

$$\Phi_z, \pi_x, -(\Phi_z) = \text{radial pulse} \tag{5}$$

where the angle $(\phi,\pi)$ describes the rotation angle of the pulse and the Cartesian axis subscript $(z, x)$ describes the axis about which the rotation occurs. For a radial pulse, the angle $\phi$ takes on all values from 0° to 360° throughout the sample.

A rotation matrix for each of these rotations can be written down that describes the rotation of a vector about the specified axis and for the specified rotation angle. These rotation matrices are:

$$\phi_z = \begin{pmatrix} \cos\phi & \sin\phi & 0 \\ -\sin\phi & \cos\phi & 0 \\ 0 & 0 & 1 \end{pmatrix} \text{ and} \tag{6}$$

$$\pi_x = \begin{pmatrix} 1 & 0 & 0 \\ 0 & -1 & 0 \\ 0 & 0 & -1 \end{pmatrix} \tag{7}$$

The overall effect of the pulse sequence can be obtained by multiplying together the rotation matrices corresponding to each pulse in the sequence.

The desired composite z pulse must be arranged so that it can be repeatedly applied without returning the spin system to the starting point. A simple $\pi$ radial pulse when repeated will be equivalent to a $2\pi$ radial pulse, so it appears that no evolution has occurred.

In accordance with the invention, the radial $\pi$ pulse can be followed by a homogeneous $\pi_x$ pulse so that the desired composite pulse has the form:

$$\pi_{radial}, \pi_x \tag{8}$$

Looking at the equivalent rotations for the radial pulse above as given in equation (5), this composite pulse can be described by the following set of rotations:

$$\Phi_z, \pi_x, -(\Phi_z), \pi_x \tag{9}$$

and, if the four corresponding rotation matrices are multiplied out to get the effect of the sequence, the overall rotation matrix for the composite pulse is:

$$\pi_{radial}, \pi_x = \begin{pmatrix} \cos 2\phi & \sin 2\phi & 0 \\ -\sin 2\phi & \cos 2\phi & 0 \\ 0 & 0 & 1 \end{pmatrix} = z_{2\phi} \tag{10}$$

which is the desired pulse. Since there is no unique phase relation between the radial and homogeneous RF fields, the homogeneous $\pi_x$ pulse can have any phase and the result will be identical.

The inventive pulse sequence is shown schematically in FIG. 3 and consists of radial pulse 300 followed by homogeneous $\pi_x$ pulse 302.

Although only one illustrative embodiment has been described in detail, the principles of the invention will immediately suggests other applications. For example, the principles of the invention are applicable in a manner which will be apparent to those skilled in the art to applications including, but not limited to other NMR experiments.

What is claimed is:

1. A composite RF pulse sequence for use in NMR experiments, which sequence causes a spatially-varying spin rotation about the z-axis when applied to a nuclear spin system in a sample and the resulting NMR signal is observed by means of a detection coil having a receiver phase, the pulse sequence comprising in combination:
   a first RF pulse that has a uniform RF field strength throughout the sample and a phase relative to the detection coil receiver phase with a spatial dependence such that all possible phase differences are equally represented throughout the sample; and a homogeneous RF $\pi_x$ pulse applied subsequent to the first RF pulse.

2. A pulse sequence in accordance with claim 1 wherein the first RF pulse is comprised of two orthogonal magnetic fields.

3. A pulse sequence in accordance with claim 1 wherein the first RF pulse is a radial pulse.

4. In an NMR experiment involving the steps of applying to NMR-active nuclei in a sample a time-invariant magnetic field having a field direction, exciting the NMR-active nuclei and applying RF pulses to the excited NMR-active nuclei to induce nuclear spin rotation, and the resulting NMR signal is observed by means of a detection coil with a phase, a method for generating a spatially-varying nuclear spin rotation about the time-invariant magnetic field direction, the method comprising the steps of:

A. applying to the NMR-active nuclei a first RF pulse that has a uniform RF field strength throughout the sample and a phase relative to the detection coil phase with a spatial dependence such that all possible phase differences are equally represented throughout the sample; and B. applying a homogeneous RF $\pi_x$ pulse to the NMR-active nuclei.

5. A method in accordance with claim 4 wherein step A comprises the steps of:

A1. applying a first RF magnetic field to the NMR-active nuclei; and

A2. simultaneously applying to the NMR-active a second RF magnetic field orthogonal to the first magnetic field.

6. A method in accordance with claim 4 wherein the first RF pulse is a radial pulse.

7. An NMR experiment comprising the steps of:

A. applying a time-invariant magnetic field having a direction to NMR-active nuclei in a sample;

B. exciting the NMR-active nuclei;

C. applying a composite RF pulse to the excited NMR-active nuclei to generate a spatially-varying nuclear spin rotation about the time-invariant magnetic field direction;

D. observing the resulting NMR signal by means of a detection coil with a phase;

wherein the composite RF pulse applied in step C comprises at least a first RF pulse that has a uniform RF field strength throughout the sample and a phase relative to the detection coil phase with a spatial dependence such that all possible phase differences are equally represented throughout the sample and a homogeneous RF $\pi_x$ pulse.

* * * * *